United States Patent [19]

Possati

[11] 4,241,509
[45] Dec. 30, 1980

[54] MODULAR ELECTRONIC APPARATUS FOR PROCESSING A PLURALITY OF MEASUREMENT SIGNALS

[75] Inventor: Mario Possati, Bologna, Italy

[73] Assignee: Finike Italiana Marposs, S.p.A., Bentivoglio-S.Marino, Italy

[21] Appl. No.: 43,124

[22] Filed: May 29, 1979

[30] Foreign Application Priority Data

May 29, 1978 [IT] Italy ................. 3453 A/78

[51] Int. Cl.³ .............................................. G01B 7/28
[52] U.S. Cl. ............................. 33/174 PA; 33/174 L
[58] Field of Search .......... 33/174 PA, 174 P, 174 Q, 33/174 L, 174 R, 169 R

[56] References Cited

U.S. PATENT DOCUMENTS

| 3,805,036 | 4/1974 | Michaud et al. | 33/174 L |
| 3,895,446 | 7/1975 | Orlov et al. | 33/174 L |
| 4,181,958 | 1/1980 | Juengel et al. | 33/174 L |

*Primary Examiner*—Willis Little
*Attorney, Agent, or Firm*—Stevens, Davis, Miller & Mosher

[57] ABSTRACT

The apparatus includes a service module which receives measurement signals from gauging heads and amplifies them, through amplification circuits, at levels permitting a subsequent direct processing and operation modules connected to the service module through a multipolar flexible cable which include programmable matrices for selecting the signals necessary for the checking to be carried out by the relevant operation module. The apparatus is particularly adapted for processing signals relating to dimensional checking of mechanical parts.

19 Claims, 3 Drawing Figures

MODULAR ELECTRONIC APPARATUS FOR PROCESSING A PLURALITY OF MEASUREMENT SIGNALS

The present invention relates to a modular electronic apparatus for multiple simultaneous checkings carried out by processing a plurality of measurement signals, with a service module, operation modules, and electric connection means for connecting the service module and the operation modules.

More particularly, the invention relates to the checking of geometrical characteristics of mechanical parts. The checking is carried out by employing gauging heads adapted to detect deviations of linear dimensions from prefixed nominal dimensions.

Electronic modular apparatuses are already known which effect multiple simultaneous checks of geometrical characteristics by processing measurement signals provided by gauging heads.

For example a known apparatus includes a main display module and operation modules, each of which is connected to relevant measuring heads. The operation modules generally include circuits for the amplification of the measurement signals received, processing circuits and comparison and indication circuits which cause resume lamps to light up in order to indicate the outcome of the associated check, thus signalling whether the checked dimension is within a prefixed tolerance range.

The output signals of the various operation modules can be switched to the main module, in order to display on its meter the actual value of the characteristic that has been checked.

The increasing diffusion of this type of apparatus is hampered by the rather high costs that are met in order to adapt the apparatus to suit specific checking applications.

In fact, in the known apparatuses the costs involved in the design and realization of the circuity connections required for adapting the apparatus to effect a certain plurality of checks are rather high, especially insofar as the wiring is concerned.

An object of the invention is to provide a modular apparatus for performing simultaneous checks that is quite versatile and involves low design and wiring costs for its adaptation to a specific application.

Another object of the invention is to provided a modular apparatus that is versatile and requires a limited number of modules.

These and other objects and advantages are obtained through an apparatus of the type outlined at the beginning of this description wherein, according to the invention, the service module includes input circuits adapted to receive the plurality of measurement signals, power supply circuits, service circuits and amplification circuits for amplifying the measurement signals, the amplification circuits being adapted to provide amplified signals suitable for directly allowing processings by the operation modules, the electric connection means are adapted to transmit power supply signals, service signals and the amplified signals to all the operation modules, and the operation modules include programming means for allowing the reception of preselected amplified signals by means of the electric connection means.

The invention is now described in detail according to a preferred embodiment given by way of non-limiting example, and illustrated in the accompanying sheet of drawings, in which.

Figure 1:
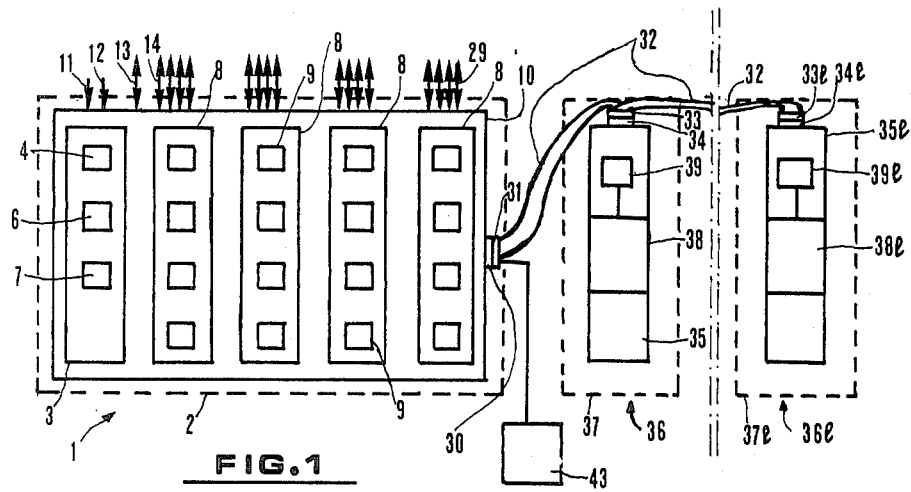
FIG. 1 is a block diagram of an apparatus including a service module and a plurality of operation modules.

With reference to FIG. 1, the service module 1 of the apparatus includes an outer casing 2 housing a printed circuit card 3, including an oscillator 4, and a circuit 6 which power supplies a thermal probe, not shown. The thermal probe provides a signal responsive to the ambient temperature that is amplified and processed by circuit 6. Card 3 also has a circuit 7 that provides reference voltages.

Casing 2 contains four other cards 8, which are indentical to one another, each of which has four power supply, detection and amplification circuits 9. Each power supply, detection and amplification circuit 9 feeds an associated measuring or gauging head, not shown, which receives the measurement signal from the gauging head, detects and amplifies it.

The electric connection of cards 3 and 8 is achieved through a rear plate 10 with printed circuits which also acts as a mechanical support for the cards. Plate 10 receives from the exterior, at inputs 11 and 12, the power supply voltage.

Rear plate 10 is also connected, through bidirectional connections 13, to the thermal probe previously mentioned, and again through bidirectional connections 14–29 to the sixteen gauging heads. The gauging heads have feelers adapted to contact various points of the mechanical part to be checked. There is a connector 30—coupled to rear plate 10—to which is plugged a connector 31 placed at an end of a flat, flexible multipolar cable 32 including a plurality of insulated conductors.

Another connector 33 is fixed to cable 32 and is plugged into a connector 34 mounted on a printed circuit card 35. Card 35 contains the circuits of an operation module 36, the outer casing of which is indicated by reference number 37.

Figure 2:
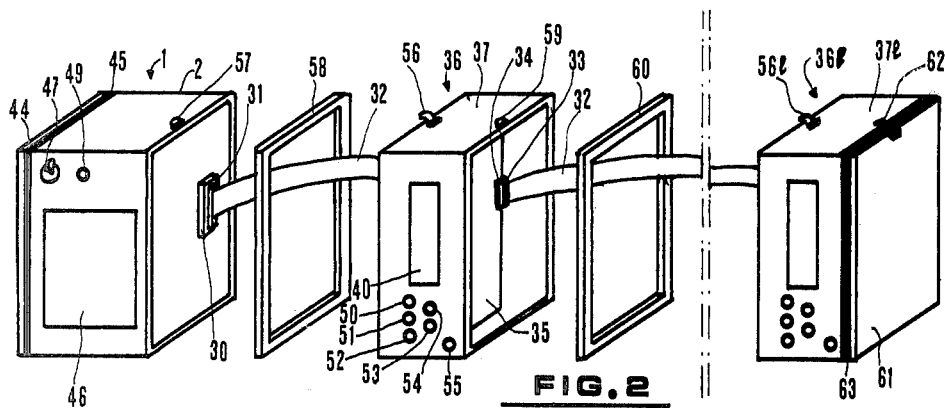
FIG. 2 is a sketch showing separately the modules of the apparatus illustrated in FIG. 1 and their electrical and mechanical connections.

The circuits of the operation module 36 basically include processing circuits 38 and driver circuits 39 of a readout meter 40 (FIG. 2).

Similarly other operation modules, the last of which is indicated by reference number 36e, are connected to the leads of cable 32. The operation modules 36 are also connected, also through a lead of cable 32, to an external control device 43, the purpose of which will become evident in the following description.

The structure of the electrical connections thus allows the disconnection of any operation module, while it keeps the other modules inserted.

The outer aspect and the mechanical structure of the apparatus are shown in FIG. 2.

Casing 2 of the service module 1 consists of a closed band with a rectangular perimeter, sealed tight at one side by means of a lateral panel 44 and an elastic gasket 45.

The five cards 8 and 3 are housed in casing 2 one beside the other and are parallel to panel 44. The side of casing 2 opposite to panel 44 is open and therefore connector 30 is accessible before the operation modules 36 are mechanically connected.

On the front face of casing 2 there is an opening which is closed by a removable front synoptic panel 46 on which are schematically shown the mechanical workpiece or part to be checked and the relevant checkings.

On the front face of casing 2 there are also a general on-off power switch 47 and a fuse 49.

Casing 37 of the operation module 36 also consists of a closed band with a rectangular perimeter, open both at the side that is adjacent to the service module 1 and at the opposite side. On the front face of casing 37 there are the readout meter 40, three resume lamps 50, 51 and 52—which indicate whether the checking made is within the tolerance range or whether it is oversize or undersize-, two potentiometers 53 and 54 for setting the tolerance limits and also a third potentiometer 55 for the final setting of the processing carried out by the operation module 36.

The mechanical connection of the operation module 36 to the service module 1 is effected by means of hooks 56 fixed to casing 37 and slots 57 obtained in casing 2, with the interposition between the two modules 1 and 36 of an elastic rectangular seal gasket 58. Gasket 58 is open in order to let cable 32 pass through it and to let the interior of service module 1 and that of operation module 36—wherein there is cable 32—to be communicating.

Similarly, the mechanical connection of the operation module 36 with the following operation module is obtained by means of hooks clamped to the latter, slots 59 obtained in casing 37 and a gasket 60. The last operation module 36e has a side closed by means of a lateral panel 61, hooks 62 and a seal tight gasket 63.

Each operation module 36, . . . 36e, as already described, contains a card 35, . . . 35e. Cards 35, . . . 35e, which are placed parallel to cards 3 and 8, are substantially identical to one another, and in any case have identical printed circuits. Cards 35, . . . 35e have programming matrices that specialize a relevant card depending on the check to be performed.

Figure 3:
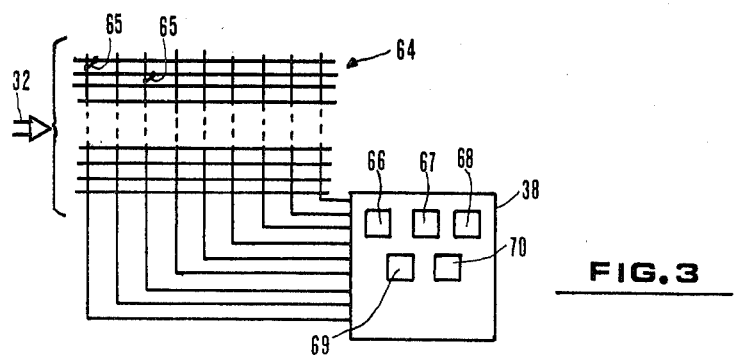
FIG. 3 is a diagram showing some of the circuits in an operation module of the apparatus illustrate in FIGS. 1 and 2.

FIG. 3 shows matrix 64 of the operation module 36. Matrix 64 includes line leads connected to connector 34, and therefore to leads of cable 32, and nine column leads. Every column lead can be connected to any line lead by means of jumpers 65.

Every operation module can process a maximum number of nine terms, corresponding to the signals present on the column leads. These signals arrive from the power supply, detection and amplification circuits 9.

The outcome of the processing can be corrected depending on the ambient temperature by utilizing the signal responsive to the measurement carried out by the thermal probe that reaches all the operation modules by means of cable 32.

The processing can consist in checking diameters, ovality, concentricity, taper, straightness, cylindricity, distances, alignment, camber, squareness, difference between the maximum and minimum values of a dimension.

In order to carry out these checkings, processing circuits 38 may be provided with resistances 66, 67 and 68 and memory circuits 69 and 70. Resistances 66, 67 and 68 define the coefficients for the processing of the measurements.

The operation of the apparatus is as follows:

The part to be checked is automatically or manually arranged on suitable mechanical references so that the feelers of the gauging heads may contact the points concerned in the checkings. The thermal probe detects the ambient temperature which normally is equal to that of the mechanical part.

The gauging heads, which in the illustrated example may be up to sixteen, and the thermal probe are fed by service module 1 and provide to the same module the measurement signals.

The dimension measurement signals are detected and amplified by service module 1 at levels such as to permit directly a subsequent processing in the operation modules 36. The service module includes, for this purpose, regulation potentiometers, not shown, constituted by sixteen zero-setting potentiometers and sixteen potentiometers for sensitivity adjustment.

All the amplified measurement signals and the necessary supply and reference signals are applied to multipolar cable 32.

The matrices 64 of the different operation modules 36, previously programmed by jumpers 65, permit the amplified dimension signals necessary for the different checkings to reach processing circuits 38. Processing circuits 38-in which, previously, possible suitable resistances 66, 67, and 68 and memories 69 and 70 are inserted and in which necessary regulations are carried out by potentiometers 53, 54 and 55—receive from service module 1, in addition to the pre-selected amplified dimension measurement signals, the other signals necessary for operation. In case the checkings need the use of memories 69 and 70, these are enabled by operating, automatically or manually, control device 43.

The checkings are performed and displayed simultaneously by the different operation modules 36. Moreover the results of the checkings are sent, through cable 32, to analogic outputs of service module 1.

The most typical applications of the above described apparatus relate to the checking of mechanical parts of rotation during their rotation on manual benches, but applications of different kinds are also possible.

In view of the almost complete elimination of wiring operations and of the separation of the problems relating to zero setting of gauging heads from those relating to the checkings, i.e. to the measurement processing, the apparatus according to this invention permits obtaining a considerable reduction in the times necessary for designing and adapting the apparatus to specific applications.

The operations for adapting the apparatus include substantially the realization of the electrical connections by jumpers applied n the matrices of the operation modules, the construction of the synoptic panel of the service module and the other operations previously described.

It is evident that the embodiment described can undergo modifications and variants equivalent from a functional and structural point of view, without departing from the scope of the invention.

What is claimed is:

1. Modular electronic apparatus for multiple simultaneous checkings carried out by processing a plurality of measurement signals, with a service module, operation modules, and electric connection means for connecting the service module and the operation modules, wherein said service module includes input circuits adapted to receive said plurality of measurement signals, power supply circuits, service circuits and amplification circuits for amplifying the measurement signals, the amplification circuits being adapted to provide amplified signals suitable for directly allowing processings by the operation modules, the electric connection means are adapted to transmit power supply signals, service signals and the amplified signals to all the operation modules, and the operation modules include programming means for allowing the reception of preselected amplified signals by means of the electric connection means.

2. The apparatus according to claim 1, wherein said programming means include programmable matrices.

3. The apparatus according to claim 1 or claim 2, wherein said electric connection means comprise a flexible multipolar cable and connectors.

4. The apparatus according to claim 3, wherein said service module and operation modules comprise casings with open sides, the apparatus including mechanical connection means for connecting the adjacent modules to one another and side panels for closing the external openings of the end modules.

5. The apparatus according to claim 4, wherein said cable is housed, upon mechanical connection of the casings, inside the casings and is adapted to maintain the modules electrically connected when the modules are mechanically detached from one another.

6. The apparatus according to claim 4, wherein said mechanical connection means comprise elastic gaskets housed between the different modules and between the end modules and said side panels and coupling means for connecting the modules.

7. The apparatus according to claim 1 or claim 2, wherein each operation module comprises indicating means for the visualization of the result of the relevant checking.

8. The apparatus according to claim 7, wherein said indicating means comprise an indicating instrument and signal lights.

9. The apparatus according to claim 1 or claim 2, wherein said operation modules comprise cards with identically printed circuits.

10. The apparatus according to claim 9, wherein each operation module comprises a single card.

11. The apparatus according to claim 1 or claim 2, wherein said operation modules include resistors for defining the processing coefficients of the relevant checkings.

12. The apparatus according to claim 11, wherein one or more operation modules include memory devices.

13. The apparatus according to claim 12, including a device for enabling said memory devices.

14. The apparatus according to claim 11, wherein each operation module comprises regulation devices relating to the relevant checking.

15. The apparatus according to claim 1 or claim 2, wherein said service module comprises zero-setting means and means for regulating the sensitivity of the measurement signals.

16. The apparatus according to claim 15, wherein said service module comprises a plurality of cards, each card being adapted to amplify several measurement signals, the cards having substantially equal printed circuits.

17. The apparatus according to claim 1 or claim 2, wherein said service module comprises a removable synoptic panel.

18. The apparatus according to claim 1 or claim 2, wherein said plurality of measurement signals comprises output signals of gauging heads for checking dimensions of mechanical parts.

19. The apparatus according to claim 18, including circuit means for providing a signal responsive to the ambient temperature and for transmitting this signal to the operation modules.

* * * * *

UNITED STATES PATENT AND TRADEMARK OFFICE
CERTIFICATE OF CORRECTION

PATENT NO. : 4,241,509

DATED : December 30, 1980

INVENTOR(S) : Mario POSSATI

It is certified that error appears in the above-identified patent and that said Letters Patent are hereby corrected as shown below:

Amend the address of the Assignee "Bentivoglio - S. Marino, Italy" to -- Bentivoglio-S. Marino (BO),Italy --.

column 1, line 49, amend "provided" to --provide-- ;

column 2, line 9, amend "illustrate" to --illustrated--, line 24, delete "which";

column 4, line 50, correct "n" after "applied" to --in-- .

Signed and Sealed this

Twenty-eighth Day of July 1981

[SEAL]

Attest:

GERALD J. MOSSINGHOFF

Attesting Officer    Commissioner of Patents and Trademarks